United States Patent

Suzuki et al.

Patent Number: 5,830,621
Date of Patent: Nov. 3, 1998

[54] PHOTOSENSITIVE ELASTOMER COMPOSITION AND PHOTOSENSITIVE RUBBER PLATE

[75] Inventors: Takao Suzuki, Narashino; Fusayoshi Sakurai, Yokohama; Haruo Ueno, Tokyo; Tomohiro Shibuya, Yokohama, all of Japan

[73] Assignee: Nippon Zeon Co., Ltd., Tokyo, Japan

[21] Appl. No.: 817,429

[22] PCT Filed: Oct. 6, 1995

[86] PCT No.: PCT/JP95/02061

§ 371 Date: Apr. 14, 1997

§ 102(e) Date: Apr. 14, 1997

[87] PCT Pub. No.: WO96/12215

PCT Pub. Date: Apr. 25, 1996

[30] Foreign Application Priority Data

Oct. 14, 1994 [JP] Japan .................................. 6-275885

[51] Int. Cl.⁶ ....................................................... G03F 7/033
[52] U.S. Cl. ..................................... 430/287.1; 430/288.1; 430/286.1; 430/910; 430/907; 522/110; 522/121
[58] Field of Search .............................. 430/288.1, 286.1, 430/287.1, 910, 907; 522/110, 121

[56] References Cited

U.S. PATENT DOCUMENTS

| | | | |
|---|---|---|---|
| 4,192,684 | 3/1980 | Gensho et al. | 430/284.1 |
| 4,195,997 | 4/1980 | Graham | 430/286.1 |
| 4,272,608 | 6/1981 | Proskow | 430/286.1 |
| 4,323,636 | 4/1982 | Chen | 430/281.1 |
| 4,758,500 | 7/1988 | Schober et al. | 430/306 |
| 5,472,824 | 12/1995 | Schober et al. | 430/309 |

FOREIGN PATENT DOCUMENTS

| | | |
|---|---|---|
| 0 699 961 A1 | 3/1996 | European Pat. Off. ............ 430/910 |
| 62-54717 | 3/1987 | Japan . |
| 4-226459 | 8/1992 | Japan . |
| 5-78507 | 3/1993 | Japan . |
| 5-232698 | 9/1993 | Japan . |
| WO 94/23342 | 10/1994 | WIPO . |

*Primary Examiner*—Cynthia Hamilton
*Attorney, Agent, or Firm*—Armstrong, Westerman, Hattori, McLeland & Naughton

[57] ABSTRACT

The present invention is intended to provide a photosensitive rubber plate high in strength balance and image reproducibility and a photosensitive elastomer composition used for obtaining the rubber plate. A photosensitive elastomer composition is obtained by kneading 65 parts by weight of a phosphoric acid ester group-containing random copolymer (monomers composition: 60% of butadiene, 9% of methyl methacrylate, 20% of 2-methacryloxyethyl phosphate, 10% of styrene and 1% of divinylbenzene), 35 parts by weight of a polystyrene-polybutadiene-polystyrene type block copolymer, 15 parts by weight of 1,7-heptanediol dimethacrylate, 1 part by weight of benzoin methyl ether and 0.02 part of methylhydroquinone. By interposing this photosensitive elastomer composition between two polyester films and pressurizing them with a press, a photosensitive rubber plate having a total thickness of 3 mm is obtained.

8 Claims, No Drawings

PHOTOSENSITIVE ELASTOMER COMPOSITION AND PHOTOSENSITIVE RUBBER PLATE

TECHNICAL FIELD

The present invention relates to a photosensitive rubber plate and a photosensitive elastomer composition. More particularly, the present invention relates to a photosensitive rubber plate which is high in strength balance and image reproducibility, as well as to a photosensitive elastomer composition used for obtaining the rubber plate.

BACKGROUND ART

Flexographic printing plates are produced by tightly fitting a negative film onto a photosensitive plate, applying an actinic ray thereto to expose part of the photosensitive layer of the plate to the ray, and washing and removing the unexposed portion of the photosensitive layer to form a relief.

The material for a photosensitive layer of a photosensitive rubber plate such as used in a flexographic printing plate is required to have excellent balance in strengths such as tensile strength, elongation and the like when made into a plate and be able to give, after light exposure and washing, a relief of narrow convex fine line and deep reverse fine line, i.e. a relief of high image reproducibility.

As the material for a photosensitive layer, there are known photosensitive elastomer compositions comprising, as essential components, an elastomer, a photopolymerizable ethylenically unsaturated monomer and a photopolymerization initiator. In order for the photosensitive elastomer compositions to be uniform, it has been a requisite that the photopolymerizable ethylenically unsaturated monomer has high compatibility with the elastomer. As specific examples of the monomer, there are known polyalkylene glycol diacrylates such as polyethylene glycol diacrylate and the like, and corresponding dimethacrylates; and polyester monomers each composed of a hydrocarbon polyalcohol of 6 or less carbon atoms and (meth)acrylic acid, such as 1,6-hexanediol diacrylate and the like.

Rubber plates using these photosensitive elastomer compositions, however, were low in strength and insufficient in image reproducibility.

DISCLOSURE OF THE INVENTION

The object of the present invention is to provide a photosensitive rubber plate which is high in strength balance and image reproducibility, and a photosensitive elastomer composition used for obtaining the rubber plate.

The present inventors made a study in order to achieve the above object. As a result, the present inventors found out that the above object can be achieved by using a photosensitive elastomer composition comprising a particular photopolymerizable ethylenically unsaturated monomer. The present invention has been completed based on the finding.

According to the present invention, there is provided a photosensitive elastomer composition comprising:

100 parts by weight of an elastomer,

5–100 parts by weight of an ester monomer composed of an ethylenically unsaturated acid and a $C_{7-14}$ straight chain hydrocarbon polyol, and 0.1–10 parts by weight of a photopolymerization initiator.

According to the present invention, there is also provided a photosensitive rubber plate of laminated structure comprising a substrate and a layer of the above photosensitive elastomer composition formed on the main surface of the substrate.

BEST MODE FOR CARRYING OUT THE INVENTION

The photosensitive elastomer composition of the present invention comprises an ester monomer composed of an ethylenically unsaturated acid and a polyol, an elastomer and a photopolymerization initiator.

The ester monomer composed of an ethylenically unsaturated acid and a polyol, which is a component of the present composition, is formed by ester bonding of an ethylenically unsaturated acid and a polyol and gives rise to a polymerization reaction in the presence of a photopolymerization initiator.

The polyol is such a polyol that at least two hydrogen atoms of a $C_{7-14}$, preferably $C_{8-12}$ straight chain hydrocarbon are replaced by hydroxyl groups. When the polyol has carbon atoms less than 7, the strength of the resulting photosensitive rubber plate is insufficient. When the polyol has carbon atoms more than 14, dispersion of ester monomer in elastomer is not uniform and the resulting photosensitive elastomer composition has nonuniform photosensitivity; therefore, the strength and image reproducibility of the photosensitive rubber plate are both insufficient.

The polyol is preferably a polyol wherein a saturated straight chain hydrocarbon group of 4 or more carbon atoms is present between the carbon atom to which one hydroxyl group is bonded and the carbon atom to which the other hydroxyl group is bonded.

Specific examples of the polyol include 1,7-heptanediol, 1,8-octanediol, 1,9-nonanediol, 1,10-decanediol, 1,12-dodecanediol, 1,14-tetradecanediol and 1,9-tetradecanediol. Of these, 1,9-nonanediol is preferred.

The ethylenically unsaturated acid is an acid having a photopolymerizable carbon-carbon unsaturated bond.

Specific examples of the ethylenically unsaturated acid include ethylenically unsaturated monocarboxylic acids such as acrylic acid, methacrylic acid and the like; ethylenically unsaturated polycarboxylic acids such as maleic acid, itaconic acid, fumaric acid and the like; and partial esters of ethylenically unsaturated polycarboxylic acids, such as monoethyl maleate, monomethyl itaconate, monoethyl fumarate and the like. Of these, ethylenically unsaturated monocarboxylic acids are preferred with methacrylic acid being particularly preferred.

Specific examples of the ester monomer composed of a polyol and an ethylenically unsaturated acid include diester monomers each composed of a polyol and an ethylenically unsaturated carboxylic acid, such as 1,7-heptanediol diacrylate, 1,7-heptanediol dimethacrylate, 1,8-octanediol diacrylate, 1,8-octanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, 1,12-dodecanediol dimethacrylate, 1,14-tetradecanediol diacrylate, 1,14-tetradecanediol dimethacrylate and the like; and monoester monomers each composed of a polyol and an ethylenically unsaturated carboxylic acid, such as 1,7-heptanediol monoacrylate, 1,7-heptanediol monomethacrylate, 1,8-octanediol monoacrylate, 1,8-octanediol monomethacrylate, 1,9-nonanediol monoacrylate, 1,9-nonanediol monomethacrylate, 1,10-decanediol monoacrylate, 1,10-decanediol monomethacrylate, 1,12-dodecanediol monoacrylate, 1,12-dodecanediol monomethacrylate, 1,14- tetradecanediol monoacrylate, 1,14-tetradecanediol monomethacrylate and the like. Of these ester monomers, preferred are diesters each composed of a polyol and methacrylic acid, with 1,9-nonanediol dimethacrylate being particularly preferred.

The amount of the ester monomer composed of a polyol and an ethylenically unsaturated acid is 5–100 parts by weight, preferably 7–70 parts by weight per 100 parts by weight of the elastomer which is a component of the photosensitive elastomer composition. When the amount is less than 5 parts by weight, the resulting photosensitive elastomer composition is insufficiently cured when exposed to light and gives a photosensitive rubber plate of low strength. When the amount is more than 100 parts by weight, the strength and solvent resistance of the photosensitive rubber plate are low.

The photosensitive elastomer composition of the present invention may further comprise, as necessary, other ethylenically unsaturated monomer, besides the ester monomer.

The ethylenically unsaturated monomer other than the ester monomer includes aromatic vinyl monomers such as styrene, o-methylstyrene, m-methylstyrene, p-methylstyrene, p-tert-butylstyrene, 1,3-dimethylstyrene, vinyltoluene, chlorostyrene, vinylnaphthalene, vinylanthracene, divinylbenzene, trivinylbenzene and the like; ethylenically unsaturated nitrile monomers such as acrylonitrile, methacrylonitrile and the like; ethylenically unsaturated carboxylic acid ester monomers each composed of an ethylenically unsaturated carboxylic acid and a polyol of 6 or less carbon atoms, such as methyl acrylate, ethyl acrylate, propyl acrylate, n-amyl acrylate, isoamyl acrylate, hexyl acrylate, ethylhexyl acrylate, octyl acrylate, glycidyl acrylate, methyl methacrylate, ethyl methacrylate, propyl methacrylate, n-amyl methacrylate, isoamyl methacrylate, hexyl methacrylate, ethylhexyl methacrylate, octyl methacrylate, hydroxyethyl acrylate, hydroxypropyl acrylate, hydroxyethyl methacrylate, hydroxypropyl methacrylate, glycidyl methacrylate, ethylene glycol diacrylate, trimethylolpropane triacrylate, 1,4-butanediol diacrylate, 1,4-butanediol dimethacrylate, propylene glycol diacrylate, 1,6-hexanediol diacrylate, 1,6-hexanediol dimethacrylate, methoxyethylene glycol acrylate, methoxypropylene glycol methacrylate, methoxyethylene glycol methacrylate, methoxypropylene glycol acrylate, diethyl maleate, dimethyl itaconate and the like; ethylenically unsaturated glycidyl ethers such as allyl glycidyl ether and the like; ethylenically unsaturated monocarboxylic acids such as acrylic acid, methacrylic acid and the like; ethylenically unsaturated polycarboxylic acids such as maleic acid, fumaric acid, citraconic acid, itaconic acid and the like; partial esters of ethylenically unsaturated polycarboxylic acids, such as monoethyl maleate, monomethyl itaconate and the like; phosphoric acid ester group-containing ethylenically unsaturated monomers such as 2-acryloxyethyl phosphate, 3-acryloxypropyl phosphate, 2-acryloxypropyl phosphate, 4-acryloxybutyl phosphate, bis(2-acryloxyethyl) phosphate, bis(3-acryloxypropyl) phosphate, bis(4-acryloxybutyl) phosphate, diethylene glycol acrylate phosphate, triethylene glycol acrylate phosphate, bis(diethylene glycol acrylate) phosphate, bis(triethylene glycol acrylate) phosphate, bis(polyethylene glycol acrylate) phosphate, methacrylates corresponding thereto, and the like; and so forth.

The elastomer, which is a component of the present photosensitive elastomer composition, has no particular restriction. It includes, for example, a homopolymer of a conjugated diene monomer; a random copolymer of a conjugated diene and an ethylenically unsaturated monomer copolymerizable therewith; and a block copolymer composed of a polymer block of a conjugated diene monomer and a polymer block of an ethylenically unsaturated monomer.

The conjugated diene monomer constituting the elastomer includes 1,3-butadiene, isoprene, 2,3-dimethyl-1,3-butadiene, 1,3-pentadiene, 1,3-hexadiene, chloroprene, etc. Of these conjugated dienes, butadiene and isoprene are preferred.

The ethylenically unsaturated monomer constituting the elastomer includes aromatic vinyl monomers such as styrene, o-methylstyrene, m-methylstyrene, p-methylstyrene, p-tert-butylstyrene, 1,3-dimethylstyrene, vinyltoluene, chlorostyrene, vinylnaphthalene, vinylanthracene and the like; ethylenically unsaturated carboxylic acid ester monomers such as methyl acrylate, ethyl acrylate, propyl acrylate, n-amyl acrylate, isoamyl acrylate, hexyl acrylate, ethylhexyl acrylate, octyl acrylate, hydroxyethyl acrylate, hydroxypropyl acrylate, glycidyl acrylate, methyl methacrylate, ethyl methacrylate, propyl methacrylate, n-amyl methacrylate, isoamyl methacrylate, hexyl methacrylate, ethylhexyl methacrylate, octyl methacrylate, hydroxyethyl methacrylate, hydroxypropyl methacrylate, glycidyl methacrylate and the like; vinyl cyanide monomers such as methacrylonitrile, acrylonitrile and the like; ethylenically unsaturated glycidyl ethers such as allyl glycidyl ethers and the like; ethylenically unsaturated carboxylic acid amide monomers such as acrylamide, methacrylamide and the like; vinyl halides such as vinyl chloride and the like; vinyl carboxylates such as vinyl acetate and the like; ethylenically unsaturated monocarboxylic acids such as acrylic acid, methacrylic acid and the like; ethylenically unsaturated polycarboxylic acids such as maleic acid, fumaric acid, citraconic acid and the like; partial esters of ethylenically unsaturated polycarboxylic acids, such as monoethyl maleate, monomethyl itaconate and the like; phosphoric acid ester group-containing ethylenically unsaturated monomers such as 2-acryloxyethyl phosphate, 3-acryloxypropyl phosphate, 2-acryloxypropyl phosphate, 4-acryloxybutyl phosphate, bis(2-acryloxyethyl) phosphate, bis(3-acryloxypropyl) phosphate, bis(4-acryloxybutyl) phosphate, diethylene glycol acrylate phosphate, triethylene glycol acrylate phosphate, polyethylene glycol acrylate phosphate, bis(diethylene glycol acrylate) phosphate, bis(triethylene glycol acrylate) phosphate, bis(polyethylene glycol acrylate) phosphate, methacrylates corresponding thereto, and the like; and so forth.

Of these ethylenically unsaturated monomers, aromatic vinyl monomers and, in particular, styrene are preferred as the monomer copolymerized with the conjugated diene monomer, or as the monomer constituting the polymer block of an ethylenically unsaturated monomer.

Specific examples of the elastomer constituting the present photosensitive elastomer composition include block copolymers such as polystyrene-polybutadiene-polystyrene type block copolymer, polystyrene-polyisoprene-polystyrene type block copolymer and the like; styrene-butadiene random copolymer and acrylonitrile-butadiene random copolymer; and hydrophilic group-containing random copolymers such as random copolymer composed of 1,3-butadiene and phosphoric acid ester group-containing ethylenically unsaturated monomer [e.g. 2-acryl oxyethyl phosphate, 3-acryloxypropyl phosphate, 2-methacryloxyethyl phosphate, 3-methacryl-oxypropyl phosphate, bis(2-acryloxyethyl) phosphate, bis(3-acryloxypropyl) phosphate, bis(2-methacryloxyethyl) phosphate or bis(3-methacryloxypropyl) phosphate], random copolymer composed of phosphoric acid group-containing ethylenically unsaturated monomer, 1,3-butadiene and alkyl ester of ethylenically unsaturated carboxylic acid, and the like.

In order for the present photosensitive elastomer composition to be able to give a photosensitive rubber plate of type developable with water, there is used, as the elastomer component of the composition, a mixture of a hydrophilic group-containing random or block copolymer and a hydrophilic group-free random or block copolymer, preferably a mixture of a hydrophilic group-containing random copolymer and a hydrophilic group-free block copolymer.

Herein, the hydrophilic group refers to a hydrophilic group such as —OH group, —COOH group, —CN group, —NH$_2$ group, —SO$_3$H group, —SO$_2$H group, —PO(OH)$_2$ group, —PO(OH)— group or the like, preferably a phosphoric acid ester group such as —PO(OH)$_2$ group, —PO(OH)— group or the like.

The hydrophilic group-containing random or block copolymer includes, for example, copolymers obtained by radical-copolymerizing a hydrophilic group-containing ethylenically unsaturated monomer with an ethylenically unsaturated monomer or a conjugated diene monomer, both copolymerizable with the former monomer; and hydrophilic group-modified copolymers obtained by reacting a hydrophilic group-free copolymer with a hydrophilic group-containing compound.

The hydrophilic group-containing ethylenically unsaturated monomer includes, for example, phosphoric acid ester group-containing ethylenically unsaturated monomers, ethylenically unsaturated monocarboxylic acids, ethylenically unsaturated polycarboxylic acids, partial esters of ethylenically unsaturated polycarboxylic acids, vinyl cyanide monomers, and hydroxyalkyl esters of ethylenically unsaturated carboxylic acids.

The amount of the hydrophilic group-containing ethylenically unsaturated monomer is generally 5–30% by weight, preferably 5–20% by weight of the total monomers used for obtaining the hydrophilic group-containing random or block copolymer. When the amount is less than 5% by weight, the resulting photosensitive elastomer composition tends to give a photosensitive rubber plate of low rate of washing. When the amount is more than 30% by weight, the resulting photosensitive elastomer composition tends to have low processability and give a photosensitive rubber plate of low aqueous ink resistance.

The elastomer used in the photosensitive elastomer composition capable of giving a photosensitive rubber plate of type developable with water, is particularly preferably a mixture of a hydrophilic group-free block copolymer and a hydrophilic group-containing random copolymer, wherein the block copolymer is composed of a polymer block containing an aromatic vinyl monomer as a main constituent unit and a polymer block containing a conjugated diene monomer as a main constituent unit and the random copolymer contains, as essential monomer units, a phosphoric acid ester group-containing ethylenically unsaturated monomer, a conjugated diene monomer and an alkyl ester of an ethylenically unsaturated carboxylic acid. The weight ratio of the hydrophilic group-free copolymer and the hydrophilic group-containing copolymer (the hydrophilic group-free copolymer/the hydrophilic group-containing copolymer) is generally 20/80 to 65/35, preferably 30/70 to 60/40.

The photopolymerization initiator, which is a component of the present photosensitive elastomer composition, generates a radical when irradiated with an actinic ray such as ultraviolet light or the like and allows the ethylenically unsaturated monomer also contained in the composition to start a polymerization reaction. Specific examples of the photopolymerization initiator are α-diketones such as diacetyl, benzyl and the like; acyloins such as benzoin, pivaloin and the like; acyloin ethers such as benzoin methyl ether, benzoin ethyl ether, benzoin isopropyl ether and the like; polynuclear quinones such as anthraquinone, 1,4-naphthoquinone and the like; and so forth.

The amount of the photopolymerization initiator is 0.1–10 parts by weight, preferably 1–7 parts by weight per 100 parts by weight of the elastomer. When the amount of the photopolymerization initiator is less than 0.1 part by weight, the resulting photosensitive composition is not sufficiently cured by an actinic ray and, therefore, gives a photosensitive rubber plate of low strength. When the amount is more than 10 parts by weight, the resulting photosensitive elastomer composition is low in photopolymerization rate.

The photosensitive elastomer composition of the present invention can comprise, as necessary, a plasticizer, a storage stabilizer, an antiozonant, etc., besides the ester monomer, the elastomer and the photopolymerization initiator.

The plasticizer includes hydrocarbon oils such as naphthenic oil, paraffinic oil and the like; a polystyrene having a molecular weight of 3,000 or less; petroleum resins; a polyacrylate; a liquid 1,2-polybutadiene, a liquid 1,4-polybutadiene and terminal-modified products thereof; a liquid acrylonitrile-butadiene copolymer, a liquid styrene-butadiene copolymer and carboxylated products thereof; and so forth.

The storage stabilizer includes phenols such as hydroquinone, pyrogallol, p-methoxyphenol, t-butylcatechol, 2,6-di-t-butyl-p-cresol, benzoquinone and the like; quinones such as benzoquinone, p-toluquinone, p-xyloquinone and the like; amines such as phenyl-α-naphthylamine and the like; and so forth.

The photosensitive elastomer composition of the present invention is produced generally by kneading the above-mentioned components by the use of a kneading machine such as kneader, roll mill or the like.

The order of kneading is not particularly restricted. However, in order to obtain a uniform composition, it is preferred to add the ester monomer and the photopolymerization initiator to the elastomer and knead them.

The photosensitive rubber plate of the present invention has a laminated structure comprising a substrate and a layer of the above-mentioned photosensitive elastomer composition formed on the main surface of the substrate.

The substrate generally consists of a flexible film or sheet and, as necessary, has an undercoat layer made of an adhesive, a release agent or a primer. The substrate can be any as long as it is generally used in flexographic printing plates, and includes, for example, flexible films such as polyethylene terephthalate film, polypropylene film, polyimide film and the like; and flexible sheets made of a polyethylene terephthalate, a polypropylene, a polyimide or the like, having, on the back side, an elastomer such as natural rubber, synthetic rubber, soft vinyl chloride resin or the like.

In the present photosensitive rubber plate, the substrate may be a foamed material. Use of a foamed material as the substrate enables control of the printing pressure applied during flexographic printing.

The formation of a layer of the photosensitive elastomer composition on the main surface of the substrate can be conducted by employing a known method. It can be conducted, for example, by molding the photosensitive elastomer composition into a sheet shape by the use of a molding machine such as extruder, press, calender or the like and thereafter press-bonding the sheet onto a substrate; or by dissolving the elastomer, the ester monomer and the photopolymerization initiator in a solvent such as chloroform, carbon tetrachloride, trichloroethane, methyl ethyl ketone, diethyl ketone, benzene, toluene, tetrahydrofuran or the like to prepare a photosensitive elastomer composition of a solution form, pouring the solution into a sheet-shaped frame and, after evaporating the solvent to form a sheet, press-bonding the sheet onto a substrate.

In the photosensitive rubber plate of the present invention, it is preferable that a thin layer made of a non-adhesive water-soluble polymer is formed, as a cover layer, on the layer of the photosensitive elastomer composition.

Since the surface of the photosensitive composition layer is generally very adhesive, there may arise the following problem when an original film is directly placed thereon. That is, air bubbles come in between the photosensitive composition layer and the original film; this causes irregular refraction of actinic ray and makes insufficient the exposure and curing of photosensitive composition layer; consequently, the reproducibility of relief is reduced; moreover, the reutilization of original film is impossible because the original film strongly adheres to the surface of the photosensitive composition layer and its peeling from said surface without impairment is difficult. Formation of a thin layer made of a non-adhesive water-soluble polymer can solve the above problems.

On the photosensitive rubber plate of the present invention can be further placed a cover film. The cover film consists of a flexible resin film. The cover film forms a protector film layer on the photosensitive composition layer (when a thin layer of water-soluble polymer is formed, on the thin layer). The cover film may have a release layer formed, by coating, on the surface coming in contact with the photosensitive composition layer. The cover film includes a polyethylene terephthalate film, a polyethylene film, a polypropylene film, a polystyrene film, etc.

The film has a thickness of generally 75–200 $\mu$m, preferably 100–150 $\mu$m. When the thickness is smaller than 75 $\mu$m, the film has insufficient strength and the resulting photosensitive rubber plate is deformed easily. When the thickness is larger than 200 $\mu$m, the film has too high strength and the peeling of film from photosensitive composition layer is difficult.

The photosensitive rubber plate of the present invention is superior in washability with water and makes easy the formation of relief with aqueous developer. The aqueous developer is generally composed of water, an alcohol, an aqueous solution or an alcoholic solution. The aqueous solution includes, for example, an aqueous alkaline solution containing an alkali metal salt, an alkaline earth metal salt or the like, and an aqueous solution containing a surfactant or the like. Of these aqueous developers, an aqueous solution containing a surfactant is preferred.

Next, the present invention is described in more detail by way of Examples. However, the present invention is in no way restricted by these Examples. In the Examples and Comparative Examples, parts and % are by weight.

Evaluation of photosensitive elastomer compositions and photosensitive rubber plates was conducted according to the following test methods.

[Evaluation of relief image]

One side of a photosensitive rubber plate (thickness: 3.0 mm) was exposed to an ultraviolet light by the use of an ultraviolet exposure unit for plate making (JE-A$_2$-SS, a product of Nihon Denshi Seiki K.K.) so that the thickness of the cured layer became about 1.5 mm. Then, the polyester film of the unexposed side of the photosensitive rubber plate was peeled; a negative film for reproducibility evaluation was tightly fitted on said side; and the side was exposed to the light emitted from the exposure unit for 15 minutes. The negative film was removed and the unexposed portion was dissolved and removed by the use of an aqueous solution of 50° C. containing 2% of a polyoxyethylene nonyl phenyl ether. Thereafter, drying was conducted at 70° C. for 20 minutes, and the unexposed portion-removed side was exposed again to the light emitted from the exposure unit for 10 minutes to form a relief image for reproducibility evaluation.

The relief image was examined for reproducibility of fine line of convex image portion and formability (depth) of fine line of reverse image portion by the use of a microscope of 50-magnification and evaluated according to the following standard.

Reproducibility of 0.2 mm-wide convex fine line

A condition in which a convex fine line was reproduced in the same width as in the negative film without deformation and enlargement, was regarded as "a condition in which the convex fine line of the negative film is reproduced completely". Evaluation was made according to the following standard.

A: A condition in which the convex fine line of the negative film is reproduced completely.

B: A condition in which the convex fine line of the negative film is reproduced almost completely.

C: A condition in which the convex fine line of the negative film is reproduced incompletely.

A rating "A" indicates a printing plate superior in reproducibility of convex fine line.

Reproducibility of 0.7 mm-wide reverse fine line

A condition in which the reverse fine line reproduced is free from any wavy notches and has sharp edges and a sufficient groove depth, was regarded as "a condition in which the reverse fine line of the negative film is reproduced completely". Evaluation was made according to the following standard.

A: The reverse fine line reproduced has a deep groove and sharp edges.

B: The groove depth of the reverse fine line reproduced is slightly small (insufficient) but has no problem in practical use.

C: The groove depth of the reverse fine line reproduced is small (insufficient) and has a problem in practical use.

A rating "A" indicates a printing plate superior in reproducibility of reverse fine line.

[Strength of plate]

The flat area of the rubber printing plate after evaluation of reproducibility of relief image was measured for tensile product (a product of tensile strength and elongation at break) under the conditions of tensile speed =500 mm/min and distance between bench marks =20 mm, according to JIS K 6301 (tensile test method). A larger tensile product indicates superior strength of rubber plate.

EXAMPLE 1

There were kneaded 65 parts of a phosphoric acid ester group-containing random copolymer (monomers composition=butadiene 60%, methyl acrylate 9%, 2-methacryloxyethyl phosphate 20%, styrene 10% and divinylbenzene 1%), 35 parts of a polystyrene-polybutadiene-polystyrene type block copolymer (vinyl bond content: 10%, weight-average molecular weight: $14 \times 10^4$), 45 parts of a liquid polybutadiene (Nisso PB B1000, a product of Nippon Soda Co., Ltd.) and 0.2 part of 2,6-di-tert-butyl-p-cresol at 150° C. by the use of a kneader until a uniform mixture was obtained. Then, the kneader temperature was lowered to 120° C., followed by addition of 15 parts of 1,7-heptanediol dimethacrylate, 1 part of benzoin methyl ether and 0.02 part of methylhydroquinone. Kneading was conducted to obtain a photosensitive elastomer composition.

The photosensitive elastomer composition was placed in a frame mold having a spacer thickness of 3.0 mm, whose upper and lower sides were open. The upper and lower open sides of the mold were covered with a polyester film of 0.1 mm in thickness. The resulting mold was pressurized at 110–130° C. at 150 kgf by the use of a press and then cooled to obtain a photosensitive rubber plate having a total thickness of 3.0 mm.

The results of evaluation of the above photosensitive elastomer composition and the above photosensitive rubber plate are shown in Table 1.

EXAMPLES 2–5 AND COMPARATIVE EXAMPLES 1–2

Photosensitive elastomer compositions and photosensitive rubber plates were obtained in the same manner as in Example 1 except that the 1,7-heptanediol dimethacrylate used in Example 1 was changed to one of the diester monomers each composed of a polyol and an ethylenically unsaturated acid, shown in Table 1.

The results of evaluation of the above photosensitive elastomer compositions and the above photosensitive rubber plates are shown in Table 1.

dimethacrylate) composed of a $C_{16}$ hydrocarbon polyol and an ethylenically unsaturated acid.

In contrast, strength of plate and image reproducibility are superior in the compositions of the present invention (Examples 1–5) each containing a diester monomer composed of a $C_{7-14}$ hydrocarbon polyol and an ethylenically unsaturated acid.

Particularly in the compositions of the present invention (Examples 2 to 4) each containing a diester monomer composed of a $C_{8-12}$ hydrocarbon polyol and methacrylic or acrylic acid, strength of plate and image reproducibility are even superior.

INDUSTRIAL APPLICABILITY

The photosensitive rubber plate produced from the photosensitive elastomer composition of the present invention is high in strength and image reproducibility and therefore useful as a flexographic printing plate.

We claim:

1. A photosensitive elastomer composition comprising:
   100 parts by weight of an elastomer comprising a mixture of a hydrophilic group-free block copolymer and a hydrophilic group-containing random copolymer,
   5–100 parts by weight of an ester monomer composed of a reaction product of an ethylenically unsaturated acid and a $C_{8-12}$ straight chain hydrocarbon polyol, wherein said ethylenically unsaturated acid is a methacrylic acid or an acrylic acid, and
   0.1–10 parts by weight of a photopolymerization initiator.

2. A photosensitive elastomer composition according to claim 1, wherein the ester monomer is a diester monomer composed of an ethylenically unsaturated acid and a $C_{8-12}$ straight chain hydrocarbon diol wherein a straight chain hydrocarbon group of 4 or more carbon atoms is present between the carbon atom to which one hydroxyl group is bonded and the carbon atom to which the other hydroxyl group is bonded.

TABLE 1

|  |  | Comp. Ex. | | Example | | | | |
|---|---|---|---|---|---|---|---|---|
|  |  | 1 | 2 | 1 | 2 | 3 | 4 | 5 |
| Ester monomer of polyol and ethylenically unsaturated acid | Carbon atoms of polyol | | | | | | | |
| 1,6-Hexanediol dimethacrylate | 6 | ○ | — | — | — | — | — | — |
| 1,7-Heptanediol dimethacrylate | 7 | — | — | ○ | — | — | — | — |
| 1,8-Octanediol diacrylate | 8 | — | — | — | ○ | — | — | — |
| 1,9-Nonanediol dimethacrylate | 9 | — | — | — | — | ○ | — | — |
| 1,12-Dodecanediol dimethacrylate | 12 | — | — | — | — | — | ○ | — |
| 1,13-Tridecanediol diacrylate | 13 | — | — | — | — | — | — | ○ |
| 1,16-Hexadecanediol dimethacrylate | 16 | — | ○ | — | — | — | — | — |
| Reproducibility of 0.2 mm-convex fine line | | A | C | A | A | A | A | A |
| Reproducibility of 0.7 mm-reverse fine line | | B | C | B | A | A | A | B |
| Strength of plate | | 5200 | 4500 | 6400 | 6700 | 7100 | 6800 | 6300 |

Note for Table 1
The mark "○" means that the ester shown in the same row was used.

As appreciated from the above, strength of plate is small in the composition (Comparative Example 1) containing a diester monomer (1,6-hexanediol dimethacrylate) composed of a $C_6$ hydrocarbon polyol and an ethylenically unsaturated acid; and image reproducibility and strength of plate are both insufficient in the composition (Comparative Example 2) containing a diester monomer (1,16-hexadecanediol 3. A photosensitive elastomer composition according to claim 1, wherein the ester monomer 1,9-nonanediol dimethacrylate.

4. A photosensitive elastomer composition according to claim 1, wherein the hydrophilic group-free block copolymer is a block copolymer composed of a polymer block containing an aromatic vinyl monomer as a main constituent unit and a polymer block containing a conjugated diene monomer as a main constituent unit.

5. A photosensitive elastomer composition according to claim 1, wherein the hydrophilic group-free block copolymer is a polystyrene-polybutadiene-polystyrene block copolymer.

6. A photosensitive elastomer composition according to claim 1, wherein the hydrophilic group-containing random copolymer is a random copolymer containing, as essential monomer units, a phosphoric acid ester group-containing ethylenically unsaturated monomer, 1,3-butadiene and an alkyl ester of an ethylenically unsaturated carboxylic acid.

7. A photosensitive rubber plate of laminated structure, comprising a substrate and a layer of a photosensitive elastomer composition of any of claims 1, 2, 3 or 4–6, formed on the main surface of the substrate.

8. A photosensitive elastomer composition according to claim 1, wherein the ethylenically unsaturated acid is a methacrylic acid.

* * * * *